United States Patent
Grygiel (10) Patent No.: US 8,110,926 B2
(45) Date of Patent: Feb. 7, 2012

(54) REDISTRIBUTION LAYER POWER GRID

(75) Inventor: Robert Peter Grygiel, San Diego, CA (US)

(73) Assignee: Broadcom Corporation, Irvine, CA (US)

(*) Notice: Subject to any disclaimer, the term of this patent is extended or adjusted under 35 U.S.C. 154(b) by 215 days.

(21) Appl. No.: 12/404,950

(22) Filed: Mar. 16, 2009

(65) Prior Publication Data
US 2010/0193959 A1 Aug. 5, 2010

Related U.S. Application Data

(60) Provisional application No. 61/148,707, filed on Jan. 30, 2009.

(51) Int. Cl.
*H01L 23/522* (2006.01)

(52) U.S. Cl. .................. 257/773; 257/E23.142; 257/48; 257/E23.002; 257/700; 257/701; 257/758; 257/778; 257/738; 257/698

(58) Field of Classification Search ............. 257/48, 257/E23.002, 773, E23.142, 700, 701, 758, 257/778, 737, 738, 698
See application file for complete search history.

(56) References Cited

U.S. PATENT DOCUMENTS

| | | | |
|---|---|---|---|
| 2004/0222478 A1* | 11/2004 | Zhang et al. | 257/422 |
| 2007/0284726 A1* | 12/2007 | Lin et al. | 257/698 |
| 2008/0128695 A1 | 6/2008 | Schieck et al. | |
| 2009/0146305 A1* | 6/2009 | Lin et al. | 257/751 |
| 2010/0246152 A1* | 9/2010 | Lin et al. | 361/783 |

OTHER PUBLICATIONS

Cullmann, Elmar, "Bumping / Redistribution Standardization?", SUSS MicroTec, Oct. 7, 2004, 8 pgs, available at http://dom.semi.org/web/wFiles.nsf/Lookup/STDEU04-FMWG-03/$file/_STDEU04-FMWG-03.pdf.
Williams et al., "RDL Manufacturing for Flip Chip Packaging", Microelectronics and Electron Devices, 2005 IEEE Worship, WMED '05, pp. 28-31, Apr. 15, 2005, available at http://ieeexplore.ieee.org/xpl/freeabs_all.jsp?arnumber=1431607.
"IC/Package Co-Design: Allegro Package Designer 620-15.2.1 and Alegro Package SI 620-15.2", Cadence, available at http://www.cdnusers.org/community/allegro/Resources/resources_pkg/Codesign/ed_Whatis_ICPackage_Codesign.pdf (last viewed Mar. 24, 2009).
Case et al., "Interconnect Working Group" 2007 Edition, International Technology Roadmap for Semiconductors, Dec. 5, 2007, 37 pgs, available at http://www.itrs.net/links/2007Winter/2007_Winter_Presentations/10_Interconnect_2007_JPold.ppt.
Saint et al., *IC Layout Basics: A Practical Guide*, McGraw-Hill, 2002 (the whole book).
Clein, Dan, *CMOS IC Layout: Concepts, Methodologies, and Tools*, Newnes, 2000 (the whole book).
Weste et al., *Principles of CMOS VLSI Design: A Systems Perspective*, Second Edition, Addison Wesley Longman, 1993 AT&T (the whole book).

* cited by examiner

*Primary Examiner* — A O Williams (74) *Attorney, Agent, or Firm* — Sterne, Kessler, Goldstein & Fox, P.L.L.C.

(57) ABSTRACT

An integrated circuit package including a first metal layer coupled to a bonding pad, a first redistribution layer coupled to the bonding pad, and a RDL to Metal (RTM) via coupled to a first surface of the metal layer and further coupled to a first surface of the first RDL is described. The IC package may further include additional metal layers and redistribution layers.

16 Claims, 7 Drawing Sheets

FIG. 1

FIG. 2A (conventional)

FIG. 2B (conventional)

FIG. 2C
(conventional)

FIG. 2D (conventional)

REDISTRIBUTION LAYER POWER GRID

CROSS REFERENCE TO RELATED APPLICATIONS

This application claims benefit of U.S. Provisional Application No. 61/148,707, entitled "Redistribution Layer Power Grid," filed Jan. 30, 2009, which is incorporated by reference herein in its entirety.

BACKGROUND

1. Field of the Invention

Embodiments of the present invention relate to integrated circuits. More specifically, certain embodiments relate to methods and apparatuses for efficiently distributing power in an integrated circuit.

2. Background

The power distribution network of an integrated circuit ("IC" or "chip") distributes power (voltage and ground) to the devices in the chip. A robust power distribution network is essential to ensure reliable operation of chip components. As chips increase in complexity, voltage drop ("IR drop") to chip components is becoming a larger problem. Shrinking device dimensions, increased number of devices, faster switching frequencies, and increased power consumption in deep sub-micrometer technologies are causing increased currents relative to conductor size, and thus IR drop. Thus, the voltage (and ground) delivered to chip components may be less than optimal. Increased IR drop causes several practical problems. For example, IR drops in the power grid reduce the maximum switching speeds and therefore limit reliable chip performance. Increased IR drop also decreases the noise margins of circuits, further limiting performance. As a result, a ten percent IR drop may reduce chip performance by seven to nine percent. If the IR drop becomes too large, critical timing paths in the chip will fail depending on manufacturing variances. Further, high average current densities may lead to electromigration in the conductors, causing premature failure of the conductor. If these effects are not addressed, the IR drop decreases the reliability of manufactured chips—i.e., if IR drop exceeds expected values on individual chips, chip yields will be decreased or functional failures may occur in the field.

A straightforward method to decrease the IR drop to each chip component is to increase the size of the die's power grid. This is often achieved by increasing the number of metal layers delivering power (voltage and ground) to chip components. Increasing the number of metal layers, however, increases the cost per chip. When a manufacturer expects to sell tens or hundreds of millions of chips, a savings of even a few pennies per chip becomes significant. Therefore, what is needed is a more robust power distribution network. What is further needed is a robust power distribution network which reduces the number of metal layers in a chip.

BRIEF SUMMARY

An integrated circuit package including a first metal layer coupled to a bonding pad, a first redistribution layer coupled to the bonding pad, and a RDL to Metal (RTM) via coupled to a first surface of the metal layer and further coupled to a first surface of the first RDL is described. The IC package may further include additional metal layers and redistribution layers.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or similar elements. Additionally, the left-most digit(s) of a reference number may identify the drawing in which the reference number first appears.

DETAILED DESCRIPTION OF THE INVENTION

Overview

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be used in a variety of other applications. The scope of the invention is not limited to the disclosed embodiments. The invention is defined by the claims appended hereto.

References to "one embodiment," "an embodiment," "this embodiment," "an example embodiment," etc., indicate that the embodiment described may include a particular feature, structure, or characteristic, but every embodiment might not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to effect such a feature, structure, or characteristic in connection with other embodiments whether or not explicitly described.

Although embodiments are applicable to any integrated circuit, in the interest of brevity and clarity a flip chip device in a flip chip ball grid array (FCBGA) package is used as an example to illustrate various features of the present invention. Embodiments of the invention are also applicable to other die and package technologies having redistribution layers. For example, embodiments of the invention might operate in devices such as wafer level chip size packages (WLCSP), wafer level ball grid array (WLBGA), flip chip molded ball grid array (FCmBGA), flip chip chip-scale package (FCCSP), and so forth.

Example Environment

Figure 1:
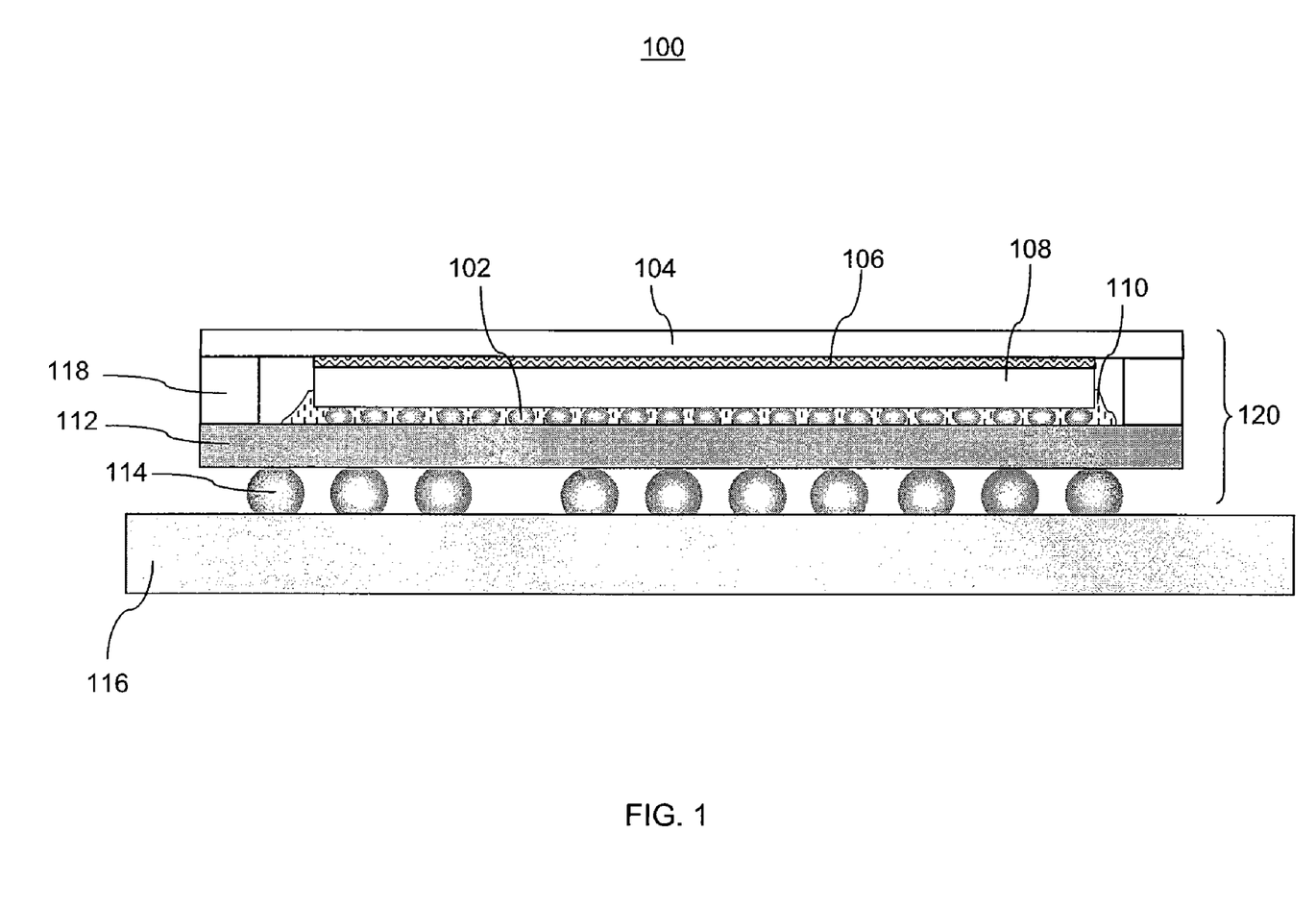
FIG. 1 illustrates an exemplary environment in which embodiments of the invention may operate.

FIG. 1 illustrates an exemplary environment 100 in which embodiments of the invention might operate. Environment 100 includes an exemplary flip chip ball grid array (FCBGA) package 120 coupled to a printed circuit board (PCB) 116 by solder balls 114.

An FCBGA environment was chosen to illustrate features of various embodiments of the invention as it is a common packaging technology. Persons of skill in the art understand that the invention is not so limited and would be applicable to other environments using a redistribution layer. FCBGA package 120 includes a substrate 112 coupled to a die 108 by a chip interface (e.g., solder bumps 102). Other coupling modes may be used for the chip interface (e.g., copper posts or bumps, gold balls, molded studs, conductive plastics, plated bumps, etc.) depending on design requirements. Underfill 110 may be used to provide structural strength and/or thermal coupling to substrate 112. FCBGA package 120 may further include lid 104 and stiffener 118 for mechanical strength and/or cooling.

A thermal interface 106 may couple die 108 to lid 104 to provide additional cooling.

Figure 2A:
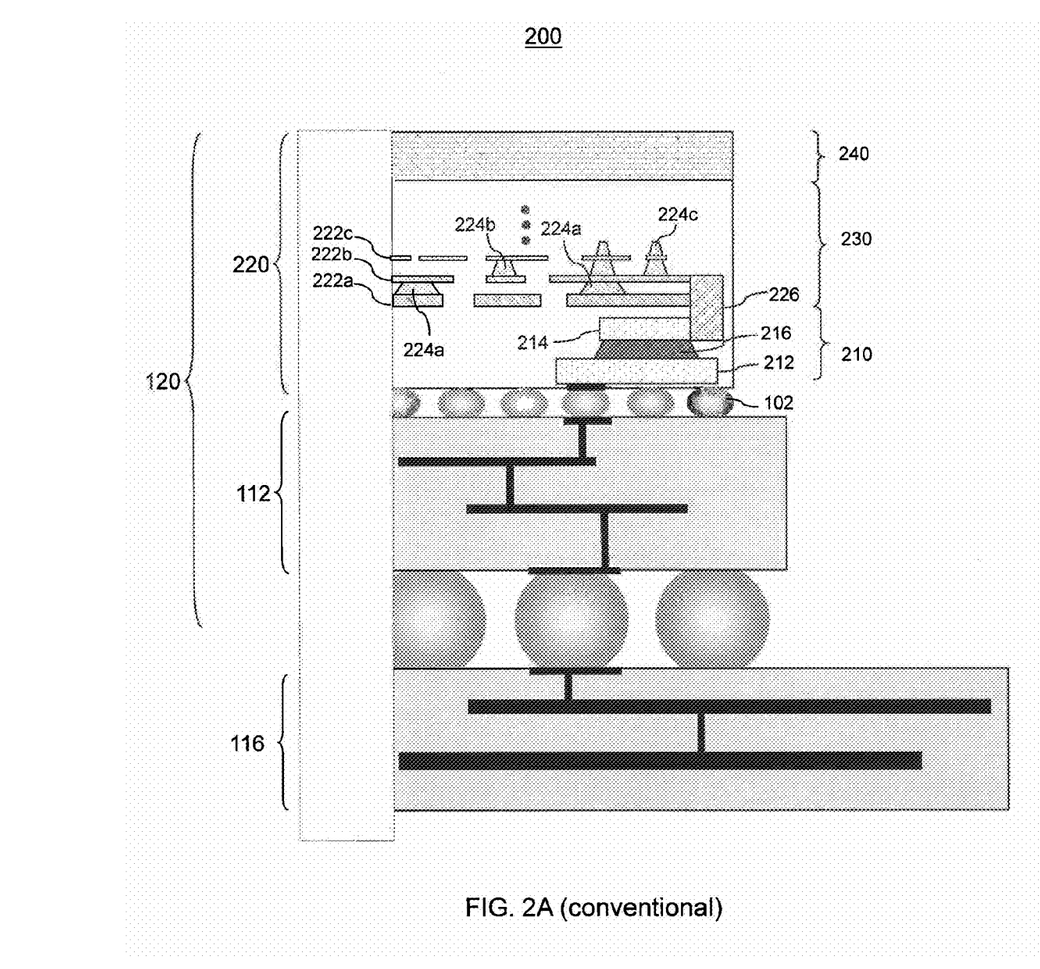
FIG. 2A illustrates a cutaway view of a portion of an exemplary conventional integrated circuit.

FIGS. 2A-2D illustrate a conventional method of distributing power (voltage and ground) to semiconductor devices within an exemplary die. FIG. 2A illustrates a cutaway view of an exemplary environment 200. In the interest of clarity and brevity, only portions of various components are illustrated, concentrating on power (voltage and ground) distribution. Environment 200 includes a conventional FCBGA package 120 coupled to the PCB 116. Conventional FCBGA package 120 includes an exemplary die 220 coupled to a substrate 112 by solder bumps 102. Die 220 includes an active layer 240, a conductive trace region 230 having metal layers 222a-222n, and a redistribution region 210. As noted above, this description concentrates on power (voltage and ground) distribution, although RDLs may typically distribute signals in addition to power.

Redistribution region 210 includes one or more redistribution layers (RDL) such as first RDL 214 and second RDL 212. RDLs are made of a metallic or non-metallic conductive material (e.g., copper, copper alloy, aluminum, aluminum alloy, etc.). RDLs typically include physically larger conductors than the metal layers of the die. RDLs are typically applied on top of the raw die at the foundry and/or the packaging house. Each RDL (e.g., first RDL 214 and second RDL 212) includes one or more RDL routes (not shown). First RDL 214 is coupled to second RDL 212 by RDL via 216. Additional RDLs coupled by RDL vias are possible but omitted from this example in the interest of brevity and clarity. RDLs typically distribute power (voltage and ground), and/or signals from bonding pads to the chip interface (e.g., solder bumps 102). RDLs may, for example, route a closely-packed bonding pads to a coarser array pattern suitable for bumps. RDLs may also be used to develop common footprints. In the example shown in FIG. 2A, first RDL 214 and second RDL 212 and RDL via 216 couple bonding pad 226 to solder bumps 102. Conductive trace region 230 includes one or more metal layers 222 (e.g., metal layers 222a, 222b, 222c, etc.) that are used to distribute signals and power (voltage and ground) to various semiconductor devices at the active layer. Metal layers may be made of any conductive material (metal or non-metal, despite the name), but are typically metallic (e.g., copper, aluminum, various alloys, etc.). Metal layers 222 are separated by a non-conducting material such as silicon dioxide (not shown). Metal layers are connected to other metal layers by metal layer vias, such as metal layer vias 224a-224c shown in FIG. 2. One or more metal layers (e.g., 222a and 222b) are coupled to bonding pad 226. Bonding pad 226 is conductive. Bonding pad 226 may be, for example, a multilayer slab of metal with no insulator between the layers. Bonding pads 226 may be on the periphery of die 220 as shown in FIG. 2A, but may be located elsewhere depending on die design. Bonding pads 226 are typically one component of an I/O pad (not shown). Therefore, power flows into die 220 through solder bump 102, through second RDL 212, RDL vias 216 to first RDL 214, out to bonding pad 226 on the periphery of die 220, then into the core of die 220 via metal layers 222 and metal layer vias 224 before supplying semiconductor devices on active layer 240.

Active layer 240 may include a semiconductor substrate having doped silicon or other semiconductor areas and may be used to form various semiconductor devices such as transistors. Power (voltage and ground) is supplied to active layer 240 from PCB 116, through substrate 112, solder bumps 102, redistribution layer 210, a bonding pad 226, metal layers 222a-222n, and metal layer vias 224.

Figure 2B:
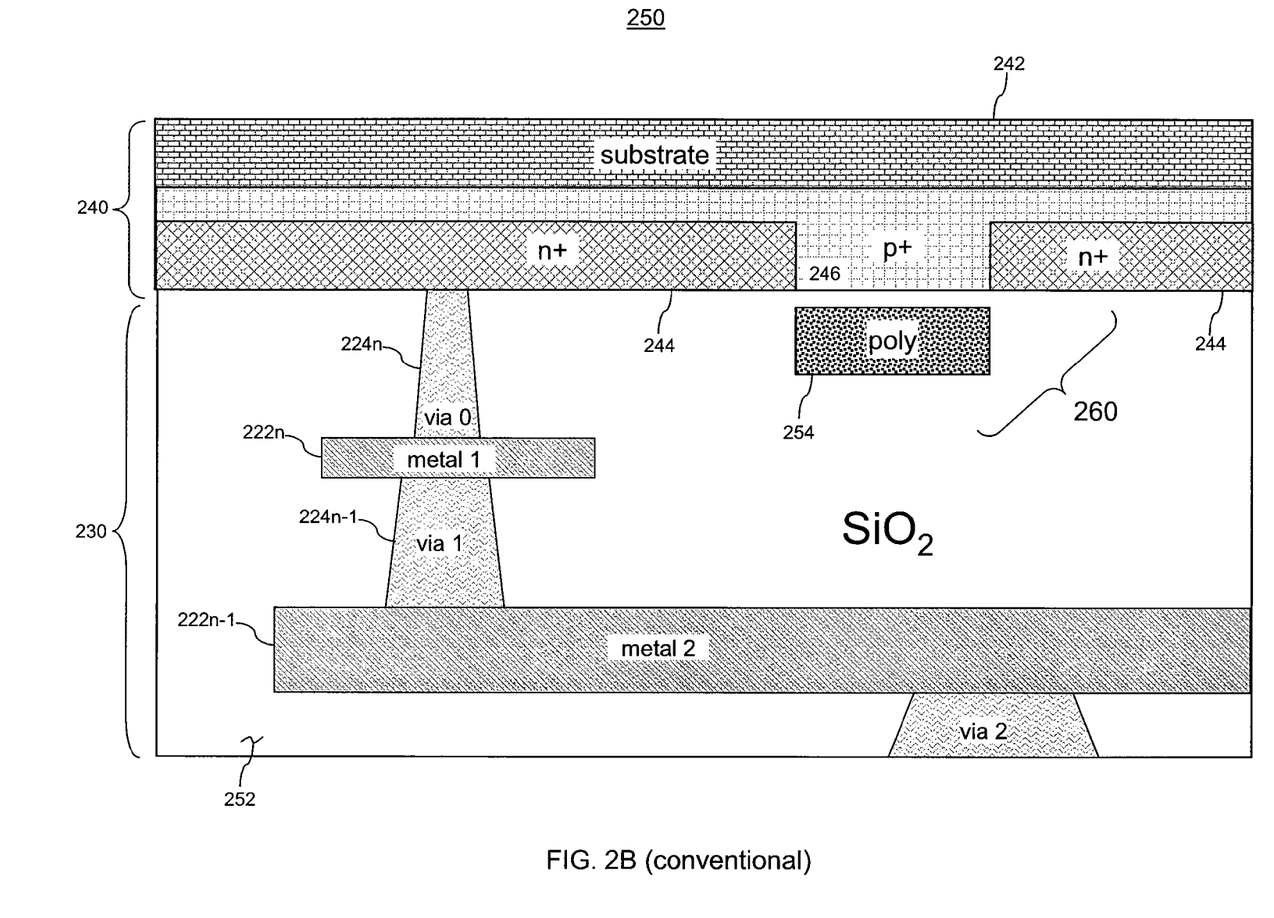
FIG. 2B illustrates a cutaway view of a portion of an exemplary conventional die.

FIG. 2B illustrates a cutaway view of an exemplary conventional die 250, focusing on the metal layers closest to the active layer. This section discussed features of the die 250 which although present in a conventional die, may benefit from features of embodiments of the present invention. Die 250 includes an active layer 240 coupled to a conductive trace region 230. Active layer 240 includes a semiconductor substrate 242 having doped silicon (e.g., n+ doped silicon 244 and p+ doped silicon 246) that may be used to form various semiconductor devices such as transistors, e.g., transistor 260.

Transistor 260 includes a poly section 254 separated by a non-conducting material (e.g., silicon dioxide 252) from p+ doped silicon 246 which is coupled to n+ doped silicon 244 on each side. Power (voltage and ground) and signals are provided to/from active layer 240 through vias (e.g., via 224n and 224(n-1)) and metal layers (e.g., metal layers 222n and 222(n-1). Metal layers 222 are separated by a non-conducting material, e.g., silicon dioxide 252, and coupled by vias 224.

Figure 2C:
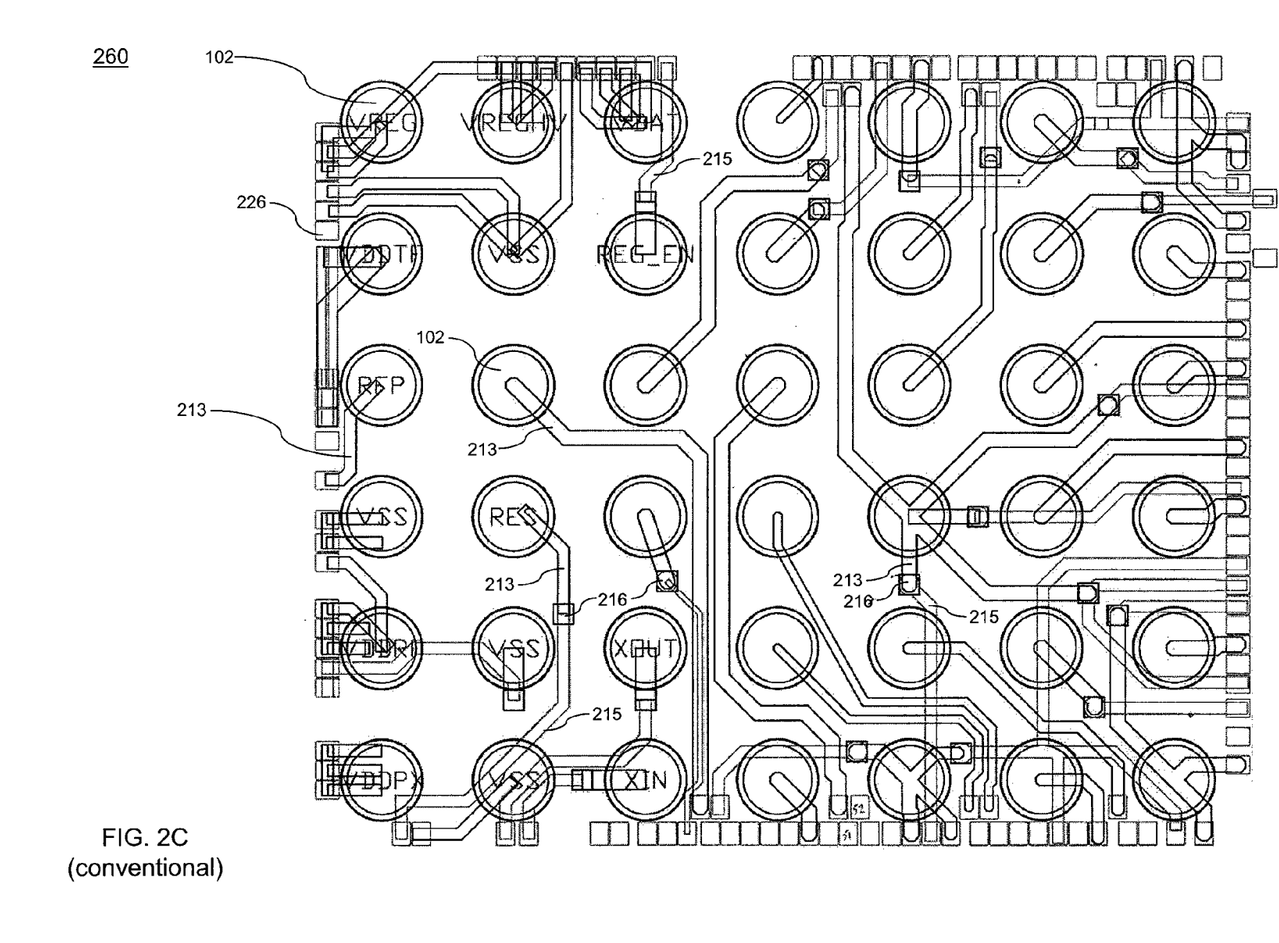
FIG. 2C illustrates a portion of an exemplary conventional die.

FIG. 2C illustrates a portion of an exemplary conventional die 260. The view of die 260 is from the top (or bottom) and shows two exemplary RDL layers (e.g., second RDL 212 and first RDL 214 as illustrated in FIG. 2B) coupled by exemplary RDL vias 216. As mentioned previously, RDL layers each include one or more RDL routes. RDL routes deliver power and signals between bonding pads and the chip's interface (e.g., solder bumps, etc.). For example, second RDL 212 may include one or more second RDL routes 213, and first RDL 214 may include one or more first RDL routes 215. A first RDL route 215 may be coupled to a second RDL route 213 by an RDL via 216. In FIG. 2C, RDL vias 216 are illustrated as squares coupling a second RDL route 213 to a first RDL route 215. Second RDL routes 213 are generally coupled to a solder ball 102.

First RDL routes 215 are not coupled to solder balls 102. Any RDL route, regardless of its associated RDL layer, may be coupled to a bonding pad 226. Both first RDL routes 215 and second RDL routes 213 may be connected to bonding pads 226. One or more bonding pads 226 typically form a portion of an I/O pad (not shown).

Figure 2D:
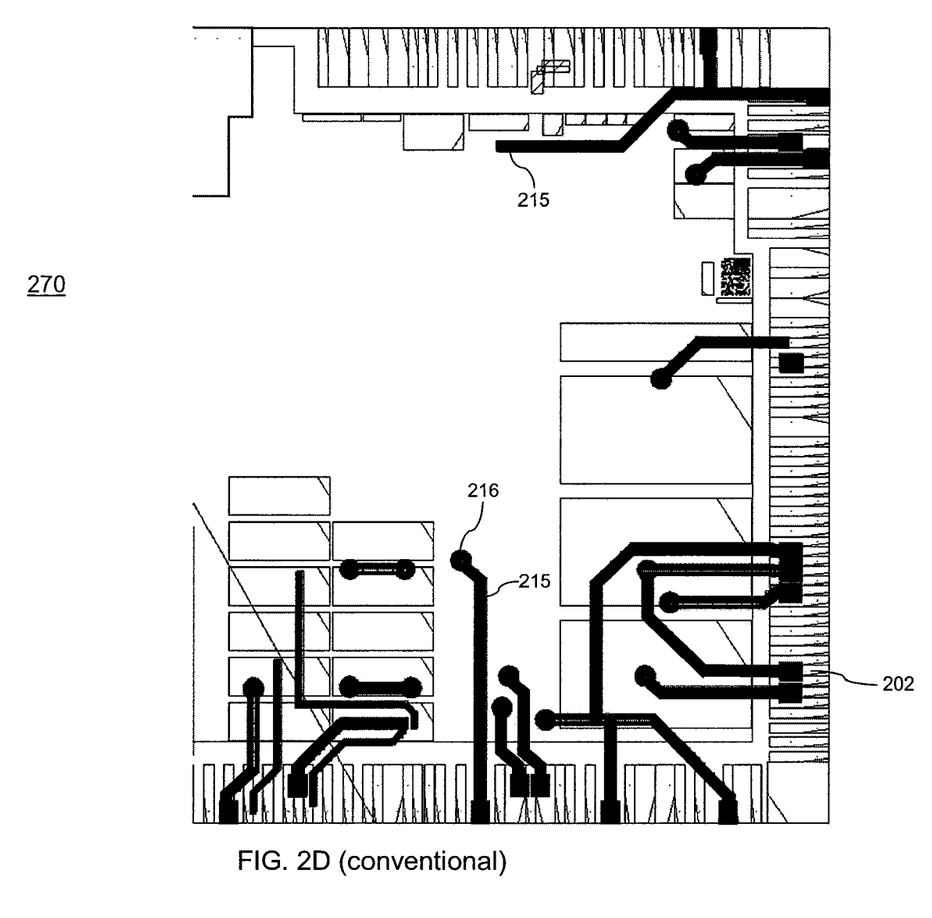
FIG. 2D illustrates a portion of an exemplary conventional die.

FIG. 2D illustrates a representation of a portion of an exemplary conventional die 270. Only some of the RDL routes of a single exemplary RDL are shown. In this example, a first RDL (e.g., RDL 214 in FIGS. 2A-2C) may include one or more first RDL routes 215, of which a portion are shown in the figure. The rounded shapes at the end of some of the exemplary RDL routes 215 are where RDL vias (e.g., RDL vias 216) may be placed to couple RDL routes 215 of the first RDL (e.g., RDL 214) to a second RDL (e.g., RDL 212 of FIGS. 2A-2C). In this example, several of the first RDL routes 215 are coupled to I/O pads 202.

Figure 3A:
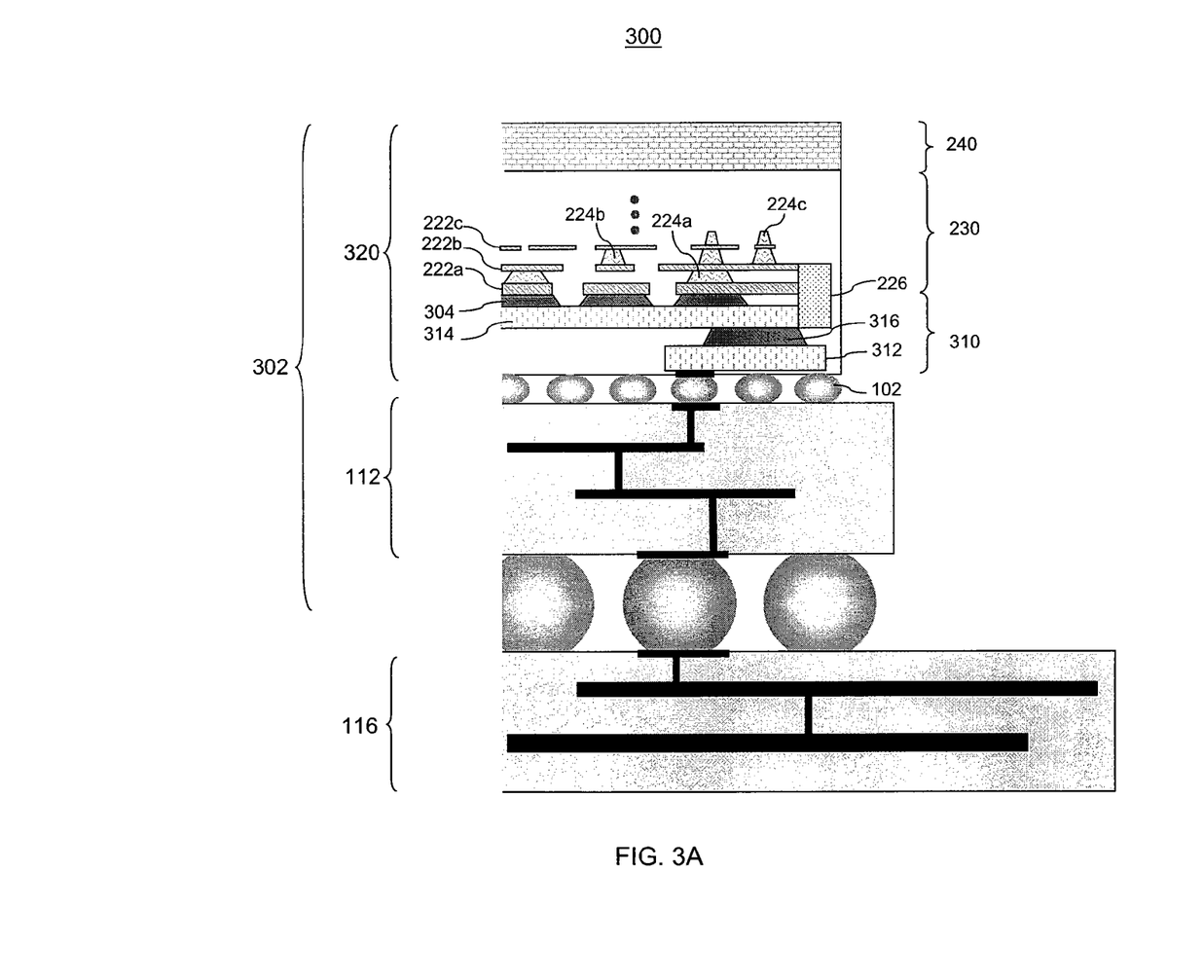
FIG. 3A illustrates a cutaway view of a portion of an exemplary integrated circuit environment according to embodiments of the invention.
Figure 3B:
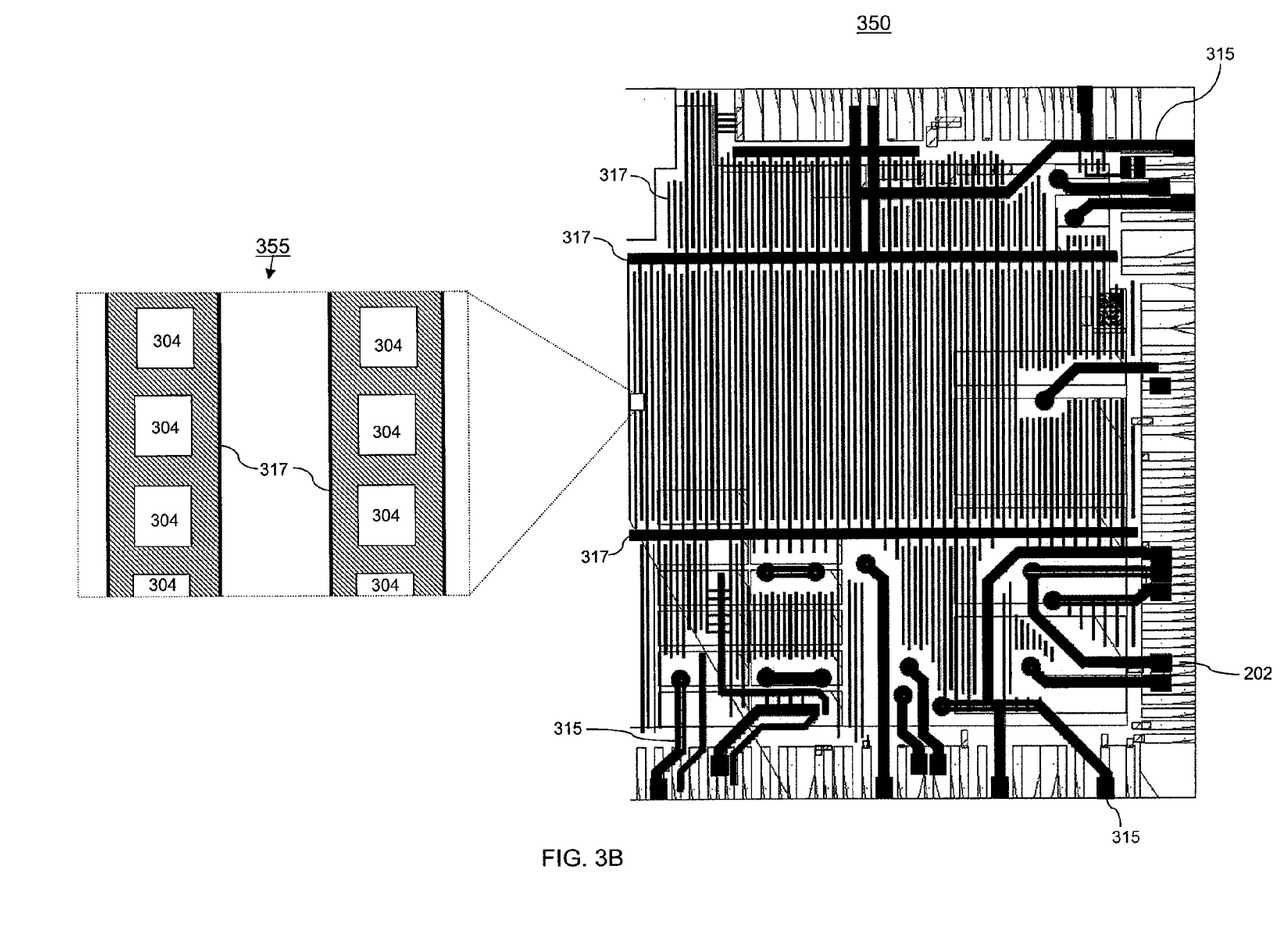
FIG. 3B illustrates a portion of an exemplary die including an example redistribution layer according to embodiments of the invention.

FIGS. 2A-2D considered together illustrate how a conventional die may suffer excessive IR drop from the chip interface (e.g., solder bumps 102) through the bonding pads (e.g., bonding pads 226) and metal layers (e.g., metal layers 222) to the semiconductor devices (e.g. transistor 260). Because RDLs are typically physically larger conductors than any of the metal layers, the IR drop is typically concentrated between the bonding pads and the semiconductor devices. To alleviate the IR drop, additional power routing and/or more direct routing may be used, but this may entail adding more metal layers. Additional layers increase the manufacturing cost for the chip. As an alternative, FIGS. 3A and 3B illustrate an exemplary embodiment of the invention that provides a robust power distribution network within the redistribution layer. The additional power routing and shorter current path reduces IR drop while minimizing the impact on manufacturing costs.

FIG. 3A illustrates a cutaway view of an exemplary environment 300 in which embodiments of the invention might operate. In the interest of clarity and brevity, only portions of various components is illustrated, concentrating on power (voltage and ground) distribution. Environment 300 includes an exemplary FCBGA package 302 coupled to an exemplary PCB 116. FCBGA package 302 includes an exemplary die 320 coupled to a substrate 112 by solder bumps 102. Die 320 includes an active layer 240, a conductive trace region 230 having metal layers 222a-222n, and a redistribution region 310. As noted above, this description concentrates on power (voltage and ground) distribution.

Redistribution region 310 includes one or more redistribution layers (RDL) such as first RDL 314 and second RDL 312. Each RDL includes one or more RDL routes (not shown). First RDL 314 is coupled to second RDL 312 by RDL via 316. Additional redistribution layers are possible but omitted from this example in the interest of brevity and clarity. First RDL 314 and second RDL 312 and RDL via 316 couple bonding pad 226 to solder bumps 102. In this example, conductive trace region 230, including one or more metal layers 222 (e.g., metal layers 222a, 222b, 222c, etc.), metal layer vias 222a-n, bonding pad 226, and active layer 240 are as previously described with reference to FIGS. 2A and 2B. However, one or more RDL-to-metal (RTM) vias 304 couple first RDL layer 314 directly to metal layer 222a. In an embodiment, first RDL layer 314 is expanded to provide a significant number of RTM vias 304 to the metal layers (e.g., metal layer 222a).

Therefore, power flows into die 320 through solder bump 102, and to second RDL RDL 312 and first RDL 314 as before. RTM vias 304, however, provide current path directly to metal layers 222. This current path may be in addition to the path through bonding pad 226. Not only is the total distance reduced, first RDL 314 is typically a larger conductor than any of the metal layers 222. Thus, the total IR drop to semiconductor devices on active layer 240 may be significantly reduced due to the decreased resistance and/or reactance of first RDL 314 relative to one or more metal layers 222. Moreover, other functions of the I/O pads is not subverted because the I/O pads are still coupled to both the metal layers and the RDL. The I/O pads may continue to provide other functions, such as electrostatic discharge (ESD) protection, albeit of an adequate size for the additional capacity delivered by RTM vias to the metal layers.

FIG. 3B illustrates a representation of a portion of an exemplary die 350 including an example RDL (e.g., RDL 314) according to embodiments of the invention. Only some of the RDL routes of a single exemplary RDL are shown. For example, a first RDL 314 may include one or more first RDL routes 315, of which a portion are shown in the figure. The rounded shapes at the end of some of the exemplary RDL routes 315 are locations where RDL vias (e.g., RDL vias 316) may be used to couple first RDL 314 to second RDL 312. In this example, one or more first RDL routes 315 are coupled to one or more I/O pads 202. In comparison to the RDL routes 215 illustrated in FIG. 2D, RDL 314 has been expanded to include a RDL power grid 317 in addition to RDL routes 315. RDL power grid 317 is shown in a 90 degree fishbone configuration, however, any configuration is possible. RDL power grid 317 may be continuous or may include one or more sections that are not directly coupled to each other. Individual RDL routes 315 may be coupled to some, all, or none of RDL power grid 317. FIG. 3B includes a magnified view 355, illustrating a small section of RDL power grid 317. In this example, RTM vias 304 are also coupled to RDL power grid 317. RTM vias 304 are also coupled to a one or more metal layers (e.g., metal layer 222a). Referring back to FIG. 3A, the side view illustrates RTM vias 304 coupling first RDL layer 314 to metal layer 222a.

Conclusion

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, the present invention should not be limited to particular embodiments disclosed, should be defined in accordance with the following claims and their equivalents.

The claims in the instant application are different than those of any parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. An integrated circuit (IC) package, comprising:
   a first metal layer coupled to a bonding pad;
   a first redistribution layer (RDL) coupled to the bonding pad; and
   a RDL to Metal (RTM) via coupled to a first surface of the metal layer and further coupled to a first surface of the first RDL.

2. The package of claim 1, further comprising:
   a second metal layer coupled to the first metal layer;
   an active layer, comprising a semiconductor device, coupled to the second metal layer.

3. The package of claim 2, further comprising a metal layer via coupling the second metal layer to a second surface of the first metal layer.

4. The package of claim 1, further comprising:
   a second RDL coupled to the first RDL.

5. The package of claim 4, further comprising an RDL via coupling a first surface of the second RDL layer to a second surface of the first RDL.

6. The package of claim 1, further comprising a plurality of RTM vias coupling the first surface of the first RDL to the first surface of the first metal layer.

7. The package of claim 1, wherein the first RDL comprises:
   a plurality of RDL routes; and
   an RDL power grid.

8. The package of claim 7, wherein the RTM via is coupled to the first surface of the first RDL at the RDL power grid.

9. The package of claim 1, wherein the first RDL distributes power to the first metal layer through the RTM.

10. The package of claim 4, further comprising one or more additional RDLs coupled to the second RDL.

11. The package of claim 10, further comprising an RDL via coupling a first surface of the second RDL layer to a second surface of the first RDL and coupling a second surface of the second RDL layer to a first surface of one of the one or more additional RDLs.

12. The package of claim 1, wherein the bonding pad consists of a conductive material.

13. The package of claim 1, wherein the RTM via consists of a conductive material.

14. The package of claim 1, wherein the respective RTM via and the respective bonding pad, each provide a current path from the first RDL to the first metal layer.

15. The package of claim 5, wherein the RDL via, the first RDL and the second RDL, in combination couple the bonding pad with solder bumps.

16. The package of claim 5, wherein the solder bumps serve as a chip interface.

* * * * *